United States Patent
Sharma et al.

(10) Patent No.: US 10,720,429 B2
(45) Date of Patent: *Jul. 21, 2020

(54) INTEGRATED CIRCUIT AND STANDARD CELL LIBRARY

(71) Applicant: Samsung Electronics Co., Ltd., Suwon-si, Gyeonggi-do (KR)

(72) Inventors: Deepak Sharma, Suwon-si (KR); Hyun-jong Lee, Hwaseong-si (KR); Raheel Azmat, Suwon-si (KR); Chul-hong Park, Seongnam-si (KR); Sang-jun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/390,431

(22) Filed: Apr. 22, 2019

(65) Prior Publication Data
US 2019/0252380 A1    Aug. 15, 2019

Related U.S. Application Data

(60) Continuation of application No. 15/496,507, filed on Apr. 25, 2017, now Pat. No. 10,297,596, which is a division of application No. 15/060,829, filed on Mar. 4, 2016, now abandoned.

(30) Foreign Application Priority Data

Jul. 29, 2015    (KR) .......................... 10-2015-0107514

(51) Int. Cl.
*H01L 27/088* (2006.01)
*H01L 27/02* (2006.01)
*H01L 23/528* (2006.01)
*H01L 27/092* (2006.01)
*H01L 29/66* (2006.01)
*H01L 21/8238* (2006.01)

(52) U.S. Cl.
CPC ........ *H01L 27/0886* (2013.01); *H01L 23/528* (2013.01); *H01L 27/0207* (2013.01); *H01L 27/0924* (2013.01); *H01L 29/6681* (2013.01); *H01L 21/823828* (2013.01)

(58) Field of Classification Search
None
See application file for complete search history.

(56) References Cited

U.S. PATENT DOCUMENTS

| 3,795,902 | A | 3/1974 | Russell |
| 8,766,322 | B2 | 7/2014 | Okamoto et al. |
| 2006/0054935 | A1 | 3/2006 | Takahata |

(Continued)

*Primary Examiner* — Steven B Gauthier
(74) *Attorney, Agent, or Firm* — Harness, Dickey & Pierce, P.L.C.

(57) ABSTRACT

Provided is an integrated circuit including at least one cell, the at least one cell includes first and second active regions spaced apart from each other, a dummy region disposed between the first and second active regions, at least one first active fin disposed in the first active region and extending in a first direction, at least one second active fin extending along the first direction over the entire length of the second active region, and an active gate line extending in a second direction that is substantially perpendicular to the first direction, wherein the active gate line vertically overlaps the first active region and the dummy region and does not vertically overlap the second active region.

19 Claims, 14 Drawing Sheets

(56) References Cited

U.S. PATENT DOCUMENTS

| | | |
|---|---|---|
| 2008/0105904 A1 | 5/2008 | Sumikawa et al. |
| 2011/0195564 A1 | 8/2011 | Liaw et al. |
| 2012/0273899 A1 | 11/2012 | Wann et al. |
| 2013/0140707 A1 | 6/2013 | Misaka et al. |
| 2013/0249014 A1 | 9/2013 | Kito |
| 2014/0077303 A1 | 3/2014 | Baek |
| 2014/0097493 A1 | 4/2014 | Baek et al. |
| 2014/0203378 A1 | 7/2014 | Ou et al. |
| 2014/0332904 A1 | 11/2014 | Wann et al. |
| 2015/0084129 A1 | 3/2015 | Lee et al. | ern
INTEGRATED CIRCUIT AND STANDARD CELL LIBRARY

CROSS-REFERENCE TO RELATED APPLICATION

This application is a Continuation application of U.S. application Ser. No. 15/496,507, filed Apr. 25, 2017, which is a Divisional application of U.S. application Ser. No. 15/060,829, filed Mar. 4, 2016; which claims priority under 35 U.S.C. § 119 to Korean Patent Application No. 10-2015-0107514, filed on Jul. 29, 2015, in the Korean Intellectual Property Office, the entire disclosure of each of which are incorporated herein by reference.

BACKGROUND

1. Technical Field

The inventive concepts relates to an integrated circuit, and more particularly, to an integrated circuit including at least one standard cell and a standard cell library storing information about the at least one standard cell.

2. Description of the Related Art

Due to development of semiconductor process technology, transistor size has been reduced, and a large number of transistors are integrated into a semiconductor device. For example, a system-on-chip (SOC), which refers to an integrated circuit (IC) in which all components of a computer or other electronic systems are integrated into a single chip, is widely used in various applications, and as performance of the applications is improved, a semiconductor device including a larger number of components is desired.

SUMMARY

At leas one of the inventive concepts provides an integrated circuit including at least one standard cell, from which an asymmetric gate structure which can be downscaled may be implemented.

At least one of the inventive concepts provides a standard cell library storing information about the at least one standard cell.

According to an aspect of the inventive concepts, there is provided an integrated circuit including at least one cell. The at least one cell includes first and second active regions spaced apart from each other, a dummy region disposed between the first active region and the second active region; at least one first active fin disposed in the first active region and extending in a first direction; at least one second active fin extending in the first direction over the entire length of the second active region; and an active gate line extending in a second direction that is substantially perpendicular to the first direction, wherein the active gate line vertically overlaps the first active region and the dummy region and does not vertically overlap the second active region.

The at least one cell may be defined by a cell boundary having a first width in the first direction and a first height in the second direction, wherein the at least one second active fin vertically overlaps the cell boundary, and a first length of the at least one second active fin in the first direction is substantially the same as the first width of the cell boundary.

The active gate line may cross the at least one first active fin in the first active region, and the first active region may be a region where an NMOS transistor or a PMOS transistor is formed, and the second active region may be a region where a dummy transistor is formed.

The integrated circuit may further include: a first contact disposed on a portion of the active gate line that is vertically overlapping the dummy region; and a plurality of second contacts disposed on the at least one first active fin and at both sides of the active gate line.

The integrated circuit may further include a dummy gate line extending in the second direction in the second active region and spaced apart from the active gate line, and a line cut region disposed between the dummy gate line and the active gate line.

The dummy gate line and the active gate line may be disposed in a straight line, with the line cut region disposed therebetween.

The line cut region may be disposed in the dummy region and spaced apart from each of the first active region and the second active region.

The integrated circuit may further include a first contact disposed on a portion of the active gate line that is vertically overlapping the dummy region, wherein the first contact and the line cut region are spaced apart from each other.

A dummy gate line may not be disposed in a portion of the second active region disposed in a straight line with the active gate line.

According to another aspect of the inventive concepts, there is provided a standard cell library that includes information about a plurality of standard cells and is stored in a computer-readable storage medium, wherein at least one of the plurality of standard cells includes: a dummy region on a semiconductor substrate; a first active region and a second active region spaced apart from each other, with the dummy region disposed therebetween; a plurality of first active fins disposed in the first active region and extending in a first direction and disposed in parallel to one another in a second direction perpendicular to the first direction; an active gate line extending in the second direction over the first active fins, the active gate line extending to a portion of the dummy region; and a first contact disposed on a portion of the active gate line disposed in the dummy region, the first contact having a first width in the second direction.

The at least one of the plurality of standard cells may further include: a plurality of second active fins extending in the first direction over the entire length of the second active region and disposed in parallel to one another in the second direction; and a dummy gate line extending in the second direction over the second active fins, the dummy gate line extending to a portion of the dummy region.

The dummy gate line and the active gate line may be spaced apart from each other, with a line cut region disposed therebetween.

The line cut region may be disposed in the dummy region, wherein a first distance between the line cut region and the first contact in the second direction is about 0.5 times to about 5 times the first width.

The at least one of the plurality of standard cells may further include: a plurality of second contacts disposed on the first active fins and at both sides of the active gate line; and a plurality of third contacts disposed on the second active fins and at both sides of the dummy gate line.

The at least one of the plurality of standard cells may further include a plurality of second active fins extending in the first direction over an entire length of the second active region and disposed in parallel to one another in the second direction, wherein a dummy gate line is not disposed in a portion of the second active region disposed in a straight line with the active gate line.

According to another aspect of the inventive concepts, there is provided a standard cell library including information about a plurality of standard cells and stored in a computer-readable storage medium, wherein at least one of the plurality of standard cells includes: a dummy region on a semiconductor substrate; a first active region and a second active region spaced apart from each other, with the dummy region disposed therebetween; a plurality of first active fins disposed in the first active region and extending in a first direction and disposed in parallel to one another along a second direction perpendicular to the first direction; a plurality of second active fins extending in the first direction over the entire length of the second active region and disposed in parallel to one another in the second direction; and an active gate line extending in the second direction, wherein the active gate line extends over the first active fins, vertically overlaps the first active region and the dummy region and does not vertically overlap the second active region.

The at least one of the plurality of standard cells may further include a dummy gate line disposed in the second active region and extending in the second direction and spaced apart from the active gate line, with a line cut region disposed therebetween.

The dummy gate line and the active gate line may be disposed in a straight line, with the line cut region disposed therebetween.

The at least one of the plurality of standard cells may further include: a first contact disposed on a portion of the active gate line vertically overlapping the dummy region; and a plurality of second contacts disposed on at least one of the first active fins and at both sides of the active gate line.

A dummy gate line may not be disposed on a portion of the second active region disposed in a straight line with the active gate line.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
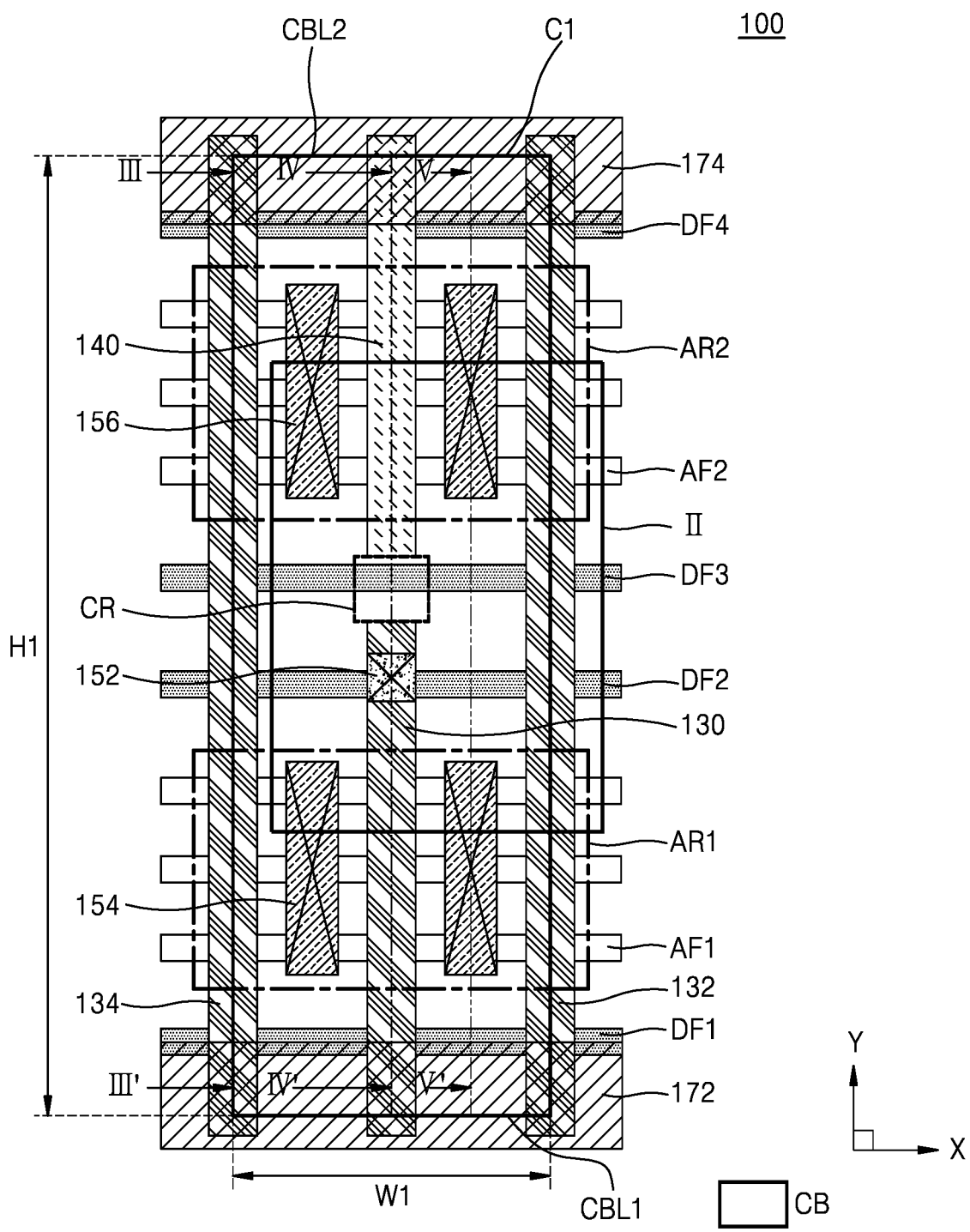
FIG. 1 is a layout of an integrated circuit according to some example embodiments.

The inventive concepts now will be described more fully hereinafter with reference to the accompanying drawings, in which elements of the invention are shown, in order to gain a sufficient understanding of the structure and effect of the inventive concepts. The inventive concepts may, however, be embodied in many different forms and should not be construed as limited to the example embodiments set forth herein. Rather, these embodiments are provided so that this disclosure will be thorough and complete, and will fully convey the scope of the inventive concepts to one of ordinary skill in the art. In the attached drawings, sizes of elements are exaggerated for convenience of description, and ratios of the elements may be exaggerated or contracted. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" or "adjacent to" another element, it may be directly on or connected the other element or intervening elements may be present. In contrast, when an element is referred to as being "directly on," "directly adjacent to" another element, there are no intervening elements present. Other words used to describe the relationship between elements should be interpreted in a like fashion (e.g., "between," versus "directly between," etc.).

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms used herein have the same meaning as commonly understood by one of ordinary skill in the art to which example embodiments belong.

An integrated circuit may be defined as a plurality of cells, and may be designed using a cell library including characteristics information of a plurality of cells. In the cell library, names, dimensions, gate widths, pins, delay characteristics, leakage current, threshold voltages, functions or the like of the cells may be defined. A typical cell library set may include basic cells such as AND, OR, NOR, or an inverter, complex cells such as OAI (OR/AND/INVERTER) and AOI (AND/OR/INVERTER), and storage elements such as a simple master-slave flip-flop or a latch.

In example embodiments of the inventive concepts described below, a cell library may be a standard cell library. A standard cell method is a method of designing an exclusive large-scale integrated circuit (LSI) that is adjusted for specifications of a customer or a user by preparing logic circuit blocks (or cells) having various functions in advance and arbitrarily combining the cells. The cells are designed and verified in advance and then registered to a computer, and logic design, placement, and routing for combination of cells by using Computer Aided Design (CAD) tools are performed.

In detail, when an LSI is designed or manufactured, if standardized logic circuit blocks (or cells) of a desired (or, alternative, predetermined) size are already stored in a library, logic circuit blocks that are suitable for a current design purpose are arranged in a plurality of cell columns, and wirings may be optimally placed to reduce wire length in the wiring space between the cells to complete the entire circuit. The larger the number of cell types stored in a library, the more flexible the design, and a possibility of optimally designed chips is further increased accordingly.

An integrated circuit manufactured using standard cells as described is a type of semi-custom integrated circuit, and is manufactured by using standard cells that are designed in advance and stored in a standard cell library and by placing the cells while providing shortest wiring between the standard cells. Thus, development costs thereof may be less than a full-custom integrated circuit, and also a period of development may be reduced.

Figure 2:
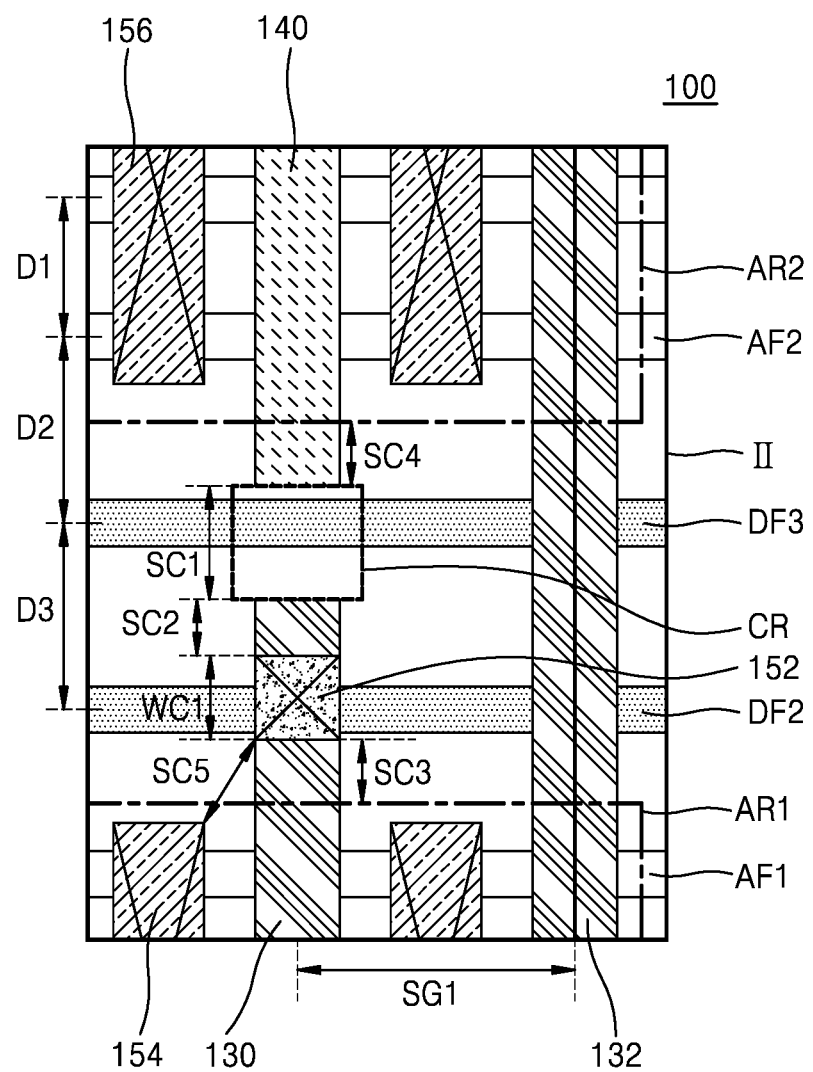
FIG. 2 is an expanded view of a portion II of the integrated circuit of FIG. 1.
Figure 3:
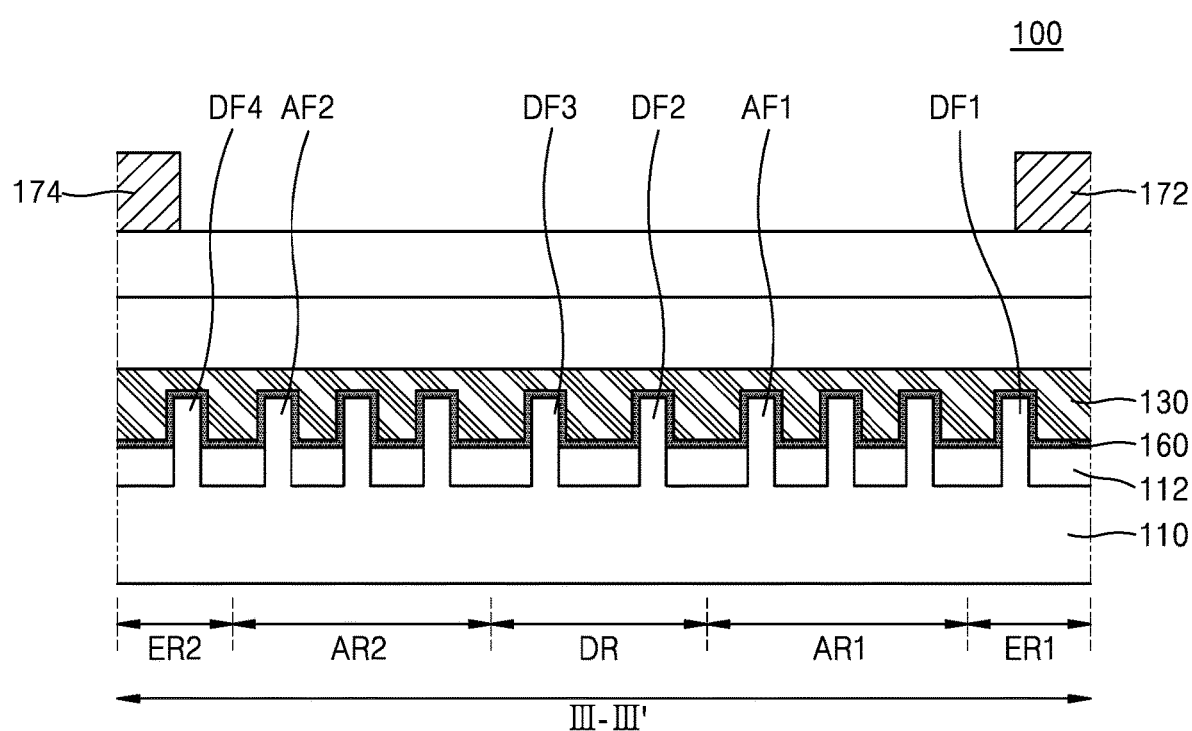
FIG. 3 is a cross-sectional view of the integrated circuit of FIG. 1 cut along a line III-III'.
Figure 4:
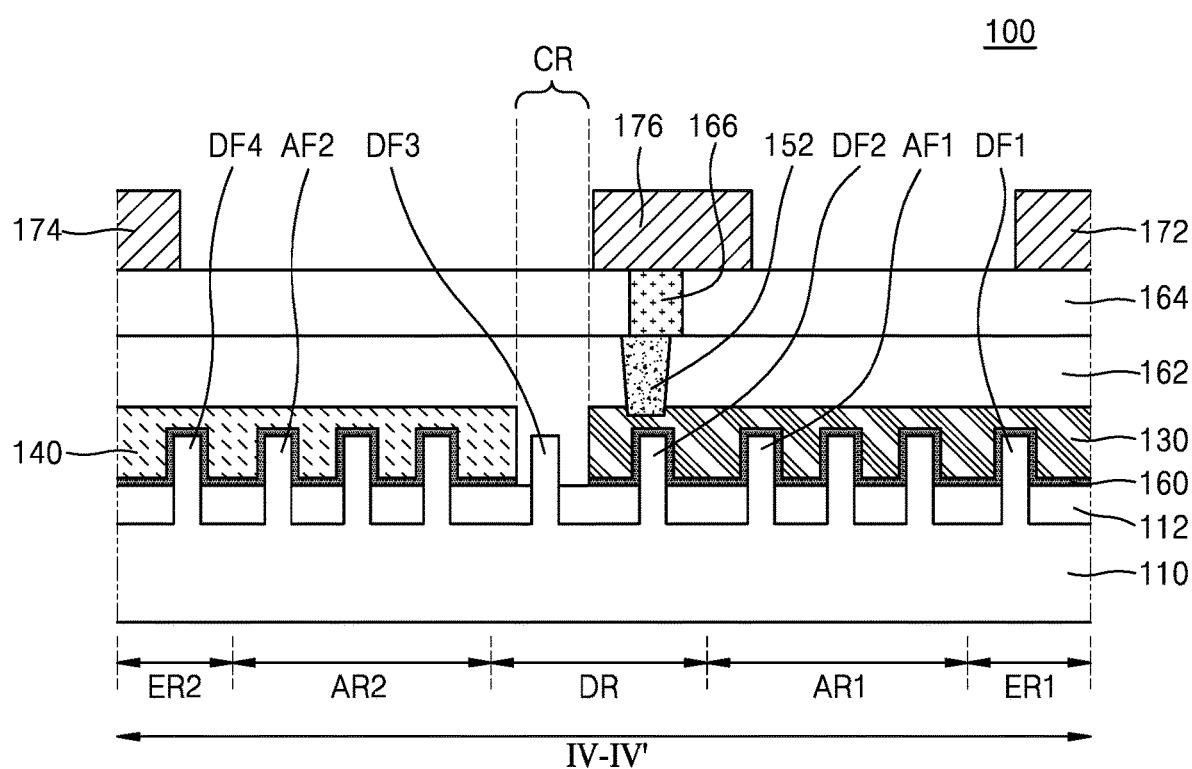
FIG. 4 is a cross-sectional view of the integrated circuit of FIG. 1 cut along a line IV-IV.
Figure 5:
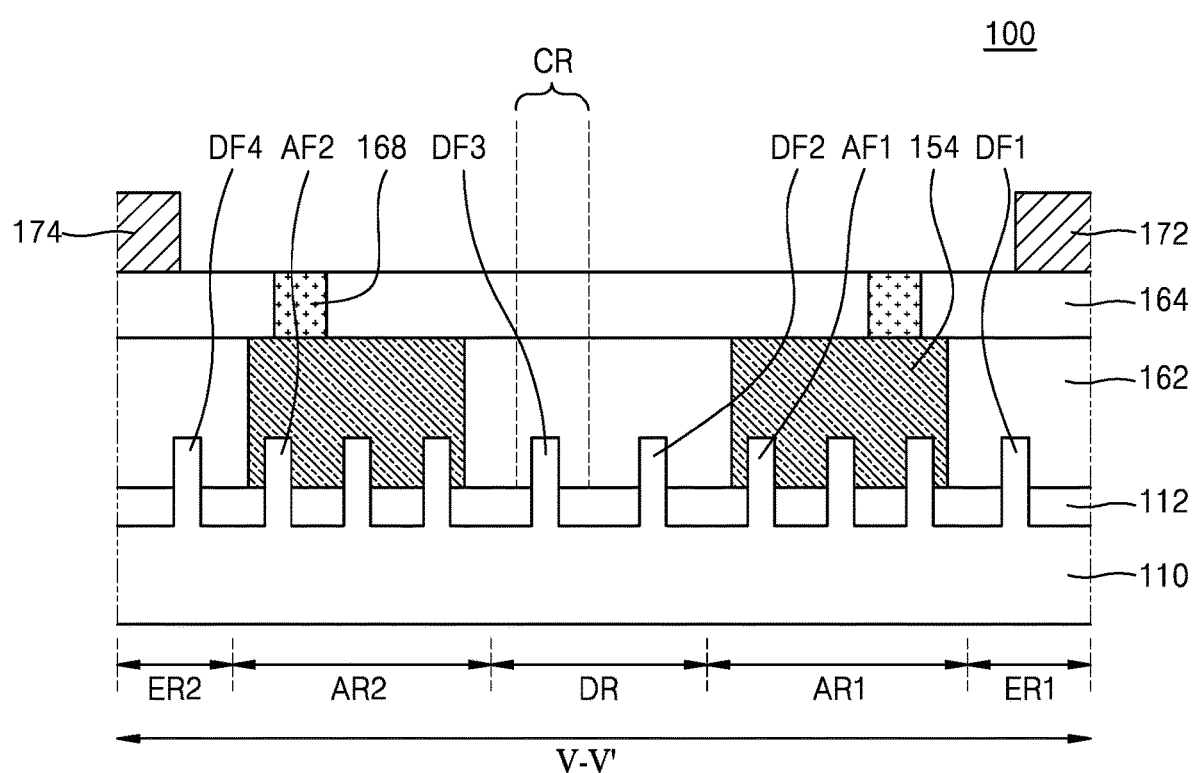
FIG. 5 is a cross-sectional view of the integrated circuit of FIG. 1 cut along a line V-V'.

FIGS. 1 through 5 are schematic views illustrating an integrated circuit 100 according to some example embodiments. FIG. 1 is a layout of the integrated circuit 100 according to some example embodiments. FIG. 2 is an expanded view of a portion II of the integrated circuit 100 of FIG. 1. FIG. 3 is a cross-sectional view of the integrated circuit 100 of FIG. 1 cut along a line III-III'. FIG. 4 is a cross-sectional view of the integrated circuit 100 of FIG. 1 cut along a line IV-IV'. FIG. 5 is a cross-sectional view of the integrated circuit 100 of FIG. 1 cut along a line V-V'.

Referring to FIG. 1, the integrated circuit 100 may include at least one cell C1 defined by a cell boundary CB.

The at least one cell C1 may include first and second active regions AR1 and AR2 that are spaced from each other, a plurality of fins extending in a first direction (e.g., X direction of FIG. 1) on a substrate 110 and being parallel to one another in a second direction (e.g., Y direction of FIG. 1) perpendicular to the first direction, and an active gate line 130 and a dummy gate line 140 extending in the second direction.

The cell boundary CB is an outline that defines at least one cell C1, and a placement and routing tool may recognize at least one cell C1 based on the cell boundary CB. The cell boundary CB may have a rectangular shape having a first width W1 along the first direction (or X direction) and a first height H1 along the second direction (or Y direction). The first height H1 may be defined to indicate a size of the at least one cell C1 along the second direction. The cell boundary CB may be defined by four cell boundary lines, and one of the four cell boundary lines, which is parallel to an extension direction of the plurality of fins may be referred to as a first cell boundary line CBL1, and one of the four cell boundary lines, which is opposite to the first cell boundary line CBL1 may be referred to as a second cell boundary line CBL2.

The at least one cell C1 may include a first active region AR1 and a second active region AR2 that are spaced apart from each other via a dummy region DR (see FIG. 3). The first active region AR1 may be adjacent to the first cell boundary line CBL1, and the second active region AR2 may be adjacent to the second cell boundary line CBL2. The dummy region DR may be disposed between the first and second active regions AR1 and AR2. The first active region AR1 may be spaced apart from the first cell boundary line CBL1 by a desired (or, alternative, predetermined) distance, and a first edge region ER1 (see FIG. 3) may be disposed between the first cell boundary line CBL1 and the first active region AR1. The second active region AR2 may be spaced apart from the second cell boundary line CBL2 by a desired (or, alternative, predetermined) distance, and a second edge region ER2 (see FIG. 3) may be disposed between the second cell boundary line CBL2 and the second active region AR2.

While only one cell C1 is schematically illustrated in FIG. 1, multiple cells C1 may also be arranged such that adjacent cells C1 share portions of the cell boundary CB in the X direction and/or the Y direction. The cells C1 may be disposed such that a first active region AR1 of one cell C1 is connected to a first active region AR1 of an adjacent cell C1, and also, such that a second active region AR2 of one cell C1 is connected to a second active region AR2 of an adjacent cell C1. Accordingly, the first and second active regions AR1 and AR2 may be spaced apart from each other and extend in the first direction (X direction), and cells C1 disposed in the first direction may be disposed to share the first and second active regions AR1 and AR2.

In some example embodiments, the first and second active regions AR1 and AR2 may be respectively an N-type impurity-doped region and a P-type impurity-doped region. In this case, an NMOS transistor may be formed in the first active region AR1, and a dummy transistor may be formed in the second active region AR2. However, the example embodiments are not limited thereto. Contrary to the above description, the first and second active regions AR1 and AR2 may be respectively a P-type impurity-doped region and an N-type impurity-doped region. In this case, a PMOS transistor may be formed in the first active region AR1, and a dummy transistor may be formed in the second active region AR2.

The plurality of fins may extend in the first direction, and may be disposed in parallel to one another in the second direction. Among the plurality of fins, at least one active fin AF1 may be disposed in the first active region AR1, and at least one second active fin AF2 may be disposed in the second active region AR2. In FIG. 1, three first active fins AF1 are disposed in parallel to one another in the first active region AR1, and three second active fins AF2 are disposed in parallel to one another in the second active region AR2. However, the example embodiments are not limited thereto, and the number of each of the first active fins AF1 and the second active fins AF2 may be varied.

When referring to FIG. 1 and FIG. 2, which is an expanded view of II in FIG. 1, the three second active fins AF2 are spaced apart from one another, and first inter-fin distances D1 between the three second active fins AF2 are identical. However, the first inter-fin distances D1 between the second active fins may also be different from one another. In addition, the first active fins AF1 may be spaced apart from one another, and inter-fin distances (not shown) between the first active fins AF1 may be identical, as illustrated in FIG. 1, or different from one another.

Dummy fins DF1, DF2, DF3, and DF4 may be disposed adjacent to at least one first active fin AF1 or at least one second active fin AF2. In detail, as illustrated in FIG. 3, a first dummy fin DF1 may be disposed in the first edge region ER1, and second and third dummy fins DF2 and DF3 may be disposed in the dummy region DR, and a fourth dummy fin DF4 may be disposed in the second edge region ER2. However, the number and placement of the dummy fins DF1, DF2, DF3, and DF4 are not limited to those illustrated in FIG. 1 or FIG. 3. The number and placement of the dummy fins DF1, DF2, DF3, and DF4 may be varied according to required performance or the like such as a function, dimensions, leakage current, a threshold voltage or the like of at least one cell C1.

When referring to FIG. 1 and FIG. 2, which is the expanded view of II of FIG. 1, the third dummy fin DF3 and the second active fin AF2 adjacent to the third dummy fin DF3 may be spaced apart from each other by a second inter-fin distance D2, and the second dummy fin DF2 that is opposite to the second active fin AF2, with the third dummy fin DF3 interposed therebetween, may be spaced apart from the third dummy fin DF3 by a third inter-fin distance D3. In addition, as described above, the three second active fins AF2 may be spaced apart from one another, and the first inter-fin distances D1 between the three second active fins AF2 are identical. In some example embodiments, the second inter-fin distance D2 may be substantially greater than the first inter-fin distance D1, and the third inter-fin distance D3 may be substantially greater than the first inter-fin distance D1. However, the example embodiments are not limited thereto, and the first through third inter-fin distances D1, D2, and D3 may be respectively varied according to required performance or the like such as a function, dimensions, leakage current, a threshold voltage or the like of at least one cell C1.

The at least one cell C1 may have a first height H1 along the second direction (Y direction), and the first height H1 may be varied based on the number of the plurality of fins and/or inter-fin distances such as the first, second, and third inter-fin distances D1, D2, and D3. In addition, while only one cell C1 is illustrated in FIG. 1, a plurality of cells C1 may be disposed adjacent to one another in the X direction and/or the Y direction. The plurality of cells C1 that are disposed adjacent to one another and share portions of the cell boundary CB may all have an identical first height H1. However, the example embodiments are not limited thereto.

The at least one cell C1 may include first and second gate lines 132 and 134 that cross the plurality of fins and extend along the second direction and are parallel to each other in the first direction. In some example embodiments, the first and second gate lines 132 and 134 and cell boundary lines extending along the second direction of the cell boundary CB may vertically overlap each other. The first and second gate lines 132 and 134 may function as dummy conductive lines which do not constitute a portion of an active device, but the example embodiments are not limited thereto.

The active gate line 130 extending in the second direction may be disposed between the first and second gate lines 132 and 134. The active gate line 130 may be disposed in the first active region AR1 to cross at least one first active fin AF1 and may extend up to a portion of the dummy region DR. While the active gate line 130 vertically overlaps the second dummy fin DF2, and an end portion of the active gate line 130 (or one of sidewalls of the active gate line 130, which faces the second active region AR2) is disposed between the second and third dummy fins DF2 and DF3 in FIG. 1, the example embodiments are not limited thereto.

When referring to FIG. 2, which is the expanded view, with FIG. 1, the active gate line 130 may be spaced apart from the first gate line 132 by a first inter-gate distance SG1, and spaced apart from the second gate line 134 also by the first inter-gate distance SG1. The first inter-gate distance SG1 may be referred to as a pitch between the active gate line 130, the first gate line 132, and the second gate line 134. Although not illustrated in FIG. 1, when a plurality of cells C1 are disposed adjacent to one another in the Y direction, two adjacent gate lines among the active gate line 130, the first gate line 132, and the second gate line 134 may be spaced apart from each other by the first inter-gate distance SG1.

The dummy gate line 140 may be spaced apart from the active gate line 130 in the second direction, in an area between the first and second gate lines 132 and 134. For example, the dummy gate line 140 and the active gate line 130 may be disposed in a straight line in the second direction. The dummy gate line 140 may be disposed to cross at least one second active fin AF2 in the second active region AR2, and may extend up to a portion of the dummy region DR.

A line cut region CR may be defined between the dummy gate line 140 and the active gate line 130. In some example embodiments, the line cut region CR may have a rectangular shape, and a sidewall of the dummy gate line 140 and a sidewall of the active gate line 130 facing each other may constitute two sides of the rectangular shape. The line cut region CR may correspond to a portion of a gate line (not shown) which is removed to form the active gate line 130 and the dummy gate line 140 from the one gate line in a process of forming the active gate line 130 and the dummy gate line 140. The active gate line 130 and the dummy gate line 140 formed during the process are spaced apart from each other.

While the line cut region CR is illustrated as having a rectangular shape in FIG. 1, alternatively, the line cut region CR may have a rectangular shape having rounded corners or may have an oval shape. However, the shape of the line cut region CR is not limited thereto. Also, sidewalls of the active gate line 130 and the dummy gate line 140 may also have other shapes based on the shape of the line cut region CR. For example, if the line cut region CR has an oval shape, the dummy gate line 140 and the active gate line 130 may each have concave sidewalls that are internally recessed along the second direction. When referring to FIG. 2, which is the expanded view, with FIG. 1, the dummy gate line 140 may be spaced apart from the active gate line 130 by a first distance SC1. Accordingly, a width of the line cut region CR in the second direction may be substantially the same as the first distance SC1.

In some example embodiments, the gate lines 130, 132, 134, and 140 may include, for example, a metal such as tungsten (W) or tantalum (Ta), a nitride thereof, a silicide thereof or a doped polysilicon. The gate lines 130, 132, 134, and 140 may be simultaneously formed so that the active gate line 130 and the dummy gate line 140 may include the same material. However, the example embodiments are not limited thereto.

A first contact 152 may be formed on a portion of the active gate line 130, which vertically overlaps the dummy region DR. The first contact 152 may be an input contact providing an electrical connection to the active gate line 130. The first contact 152 may be spaced apart from a sidewall of the active gate line 130, that is, a sidewall of the active gate line 130 that forms a boundary surface of the line cut region CR, by a second distance SC2 along the second direction. Also, the first contact 152 may be spaced apart from the first active region AR1 by a third distance SC3 in the second direction. The first through third distances SC1, SC2, and SC3 will be described later.

A second contact 154 may be disposed on at least one first active fin AF1 and at both sides of the active gate line 130. The second contact 154 may be source and drain contacts providing power connection and ground connection to an active transistor device formed in the first active region AR1. While the second contact 154 is illustrated in FIG. 1 to cross all of the three first active fins AF1 that are parallel to one another, the example embodiments are not limited thereto. Unlike FIG. 1, the second contact 154 may be formed to cross one or two first active fins AF1 among the three parallel first active fins AF1. The second contact 154 may be spaced apart from the first contact 152 by a fifth distance SC5 in a horizontal direction, that is, the second contact 154 may be spaced apart from the first contact 152 on a X-Y plane. While the second contact 154 is illustrated in FIG. 1 as being formed in the first active region AR1, alternatively, the second contact 154 may be extended to a portion of the dummy region DR in the second direction so that a portion of the second contact 154 vertically overlaps the dummy region DR.

A third contact 156 may be disposed on at least one second active fin AF2 and at both sides of the dummy gate line 140. The third contact 156 may provide electrical connection with respect to a dummy transistor device formed in the second active region AR2.

Hereinafter, arrangement between the first through third contacts 152, 154, and 156 and the active gate line 130 and the dummy gate line 140 will be described in detail with reference to FIG. 2.

Referring to FIG. 2, the active gate line 130 and the dummy gate line 140 may be spaced apart from each other by the first distance SC1 in the second direction to be disposed in a straight line. The first distance SC1 may be substantially the same as a width of the line cut region CR defined between the active gate line 130 and the dummy gate line 140. This is because, after forming one gate line (not shown), a portion of the gate line, which overlaps the line cut region CR, may be removed by using, for example, a patterning process, to thereby form two separate portions, that is, the active gate line 130 and the dummy gate line 140. Thus, the first distance SC1 may be greater than a minimum width of a hole pattern which may be formed in the patterning process, but the example embodiments are not limited thereto.

The first contact 152 may be disposed on the active gate line 130 and may have a second width WC1 in the second direction. In an example process to form the first contact 152, after forming a first insulation interlayer 162 (see FIG. 4) covering the active gate line 130, a hole (not shown) exposing an upper surface of the active gate line 130 is formed in the first insulation interlayer 162 by using a patterning process or the like, and the hole is filled with a conductive material to thereby form the first contact 152. The second width WC1 of the first contact 152 may be greater than a minimum width of a hole pattern that may be formed in the patterning process, but the example embodiments are not limited thereto.

Also, the first contact 152 may be spaced apart from the line cut region CR by the second distance SC2. In some example embodiments, the second distance SC2 may be about 0.5 times to about 5 times the second width WC1 of the first contact 152, but is not limited thereto. If the second distance SC2 is too small, the first contact 152 may not be sufficiently in contact with the active gate line 130 when misalignment occurs during the forming process of the first contact 152. In addition, if the second distance SC2 is too great, a portion of the height H1 of the at least one cell C1 corresponding to the dummy region DR is increased so that an area of the at least one cell C1 may be increased, and this may be disadvantageous to downscaling of an integrated circuit including the at least one cell C1.

The first contact 152 may be spaced apart from the first active region AR1 by a third distance SC3, and the line cut region CR may be spaced apart from the second active region AR2 by a fourth distance SC4. The third distance SC3 may be about 0.5 time to about 5 times as the second width WC1 of the first contact 152, and the fourth distance SC4 may be about 0.5 time to about 5 times as the second width WC1 of the first contact 152, but the third and fourth distances SC3 and SC4 are not limited thereto. For example, if the third and fourth distances SC3 and SC4 are too small, and if misalignment occurs in a patterning process of forming the first contact 152 and the line cut region CR, a contact hole may be formed in portions of the first and second active regions AR1 and AR2, and electrical characteristics of an active transistor device may be changed due to the contact holes. If the third and fourth distances SC3 and SC4 are too great, a portion of the height H1 of the at least one cell C1 corresponding to the dummy region DR may be increased, and accordingly, an area of the at least one cell C1 may be increased, and this may be disadvantageous to downscaling of an integrated circuit including the at least one cell C1.

The second contact 154 may be disposed on the first active region AR1 and at both sides of the active gate line 130 and may be spaced apart from the first contact 152 by a fifth distance SC5. The fifth distance SC5 may be about 0.5 time to about 5 times as the second width WC1 of the first contact 152, but the fifth distance SC5 is not limited thereto. If the fifth distance SC5 is too small, when misalignment occurs in patterning processes for forming the first contact 152 and/or the second contact 154, for example, bridge defects or undesired electrical connection between the first contact 152 and the second contact 154 may be caused. If the fifth distance SC5 is too great, an area of the second contact 154 in the first active region AR1 is reduced, and thus it may be difficult to form the second contact 154 having a sufficiently low contact resistance.

As described above, as the first contact 152, the second contact 154, and the line cut region CR are arranged in the dummy region DR as illustrated in FIG. 2, a sufficient margin may be provided in the manufacturing process of the at least one cell C1, and the area of the at least one cell C1 may be reduced at the same time.

Referring to FIG. 1, the at least one second active fin AF2 may extend over the entire length of the second active region AR2 along the first direction (or X direction). That is, a dummy transistor may be formed of a portion of the dummy gate line 140 that crosses the at least one second active fin AF2, without removing the at least one active fin AF2. That is, a length of the at least one second active fin AF2 along the first direction may be substantially the same as the first width W1 of the at least one cell C1 that overlaps the at least one second active fin AF2.

When an active break region is formed, in which no fins are disposed, by removing second active fins disposed in a second active region, in order to form a dummy transistor, the more the second active fins, the greater may be a minimum width of the active break region. In this case, a pitch between gate lines may also be increased, and a cell area (or a first width in the first direction) may be increased, and accordingly, it may be difficult to form a cell having a compact area.

However, in the at least one cell C1 described above, the at least one active fin AF2 is not removed, but the active gate line 130 and the dummy gate line 140 are spaced apart from each other by the line cut region CR so as to form a dummy transistor device in the second active region AR2. Accordingly, the at least one cell C1 may have the first width W1 which is relatively small, and an area of the at least one cell C1 may also be relatively small. In other words, even when an active break region, which is in the second active region AR2 and from which the at least one second active fin AF2 is removed, is not formed, a dummy transistor is formed of the active gate line 130 and the dummy gate line 140 that is spaced apart from the active gate line 130, and thus, there is no need to increase a cell boundary width (or the first width W1) to provide a margin in a patterning process for forming an active break region. Thus, downscaling of the integrated circuit 100 including the at least one cell C1 may be facilitated.

Hereinafter, additional components included in the at least one cell C1 will be described with reference to FIGS. 3 through 5.

Referring to FIGS. 3 through 5, an isolation layer 112 may be formed on two sidewalls of each of the active fins AF1 and AF2 and the dummy fins DF1, DF2, DF3, and DF4, and a gate insulation layer 160 having a desired (or, alternative, predetermined) thickness may be formed between the active fins AF1 and AF2 and the dummy fins DF1, DF2, DF3, and DF4, and the active gate line 130. Also, the gate insulation layer 160 may also be formed between the active fins AF1 and AF2 and the dummy fins DF1, DF2, DF3, and DF4, and the dummy gate line 140.

The first insulation interlayer 162 may cover the substrate 110 on which the isolation layer 112, the active gate line 130, the dummy gate line 140, the first contact 152, and the second contact 154 are formed, and the second insulation interlayer 164 may be formed on the first insulation interlayer 162.

A first wiring layer 172, a second wiring layer 174, and a third wiring layer 176 may be disposed on the second insulation interlayer 164. In some example embodiments, the first wiring layer 172 may be a power line through which power is transmitted to at least one cell C1, and the second wiring layer 174 may be a ground line via which the at least one cell C1 is connected to a ground. In addition, the third wiring layer 176 may be an input signal line via which an input signal is transmitted to the at least one cell C1. However, the example embodiments are not limited thereto, and the first through third wiring layers 172, 174, and 176 may be routing layers that perform any one of the above-described functions.

In some example embodiments, the first contact 152 may be connected to the third wiring layer 176 via a first via 166, and the second contact 154 may be connected to the first wiring layer 172 and/or the second wiring layer 174 via a second via 168, but the example embodiments are not limited thereto.

The integrated circuit 100 described with reference to FIGS. 1 through 5 may include at least one cell C1, and the at least one cell C1 may be a primitive cell that is stored in a standard cell library and may be used in a design process of a standard cell.

In general, in a design process of a standard cell, that is, in a process of generating a standard cell library, a layout of a standard cell may be designed based on characteristics of a target standard cell. However, in a process of disposing a standard cell, characteristics of a target standard cell may be changed based on a layout pattern of an adjacent standard cell that is disposed adjacent to the target standard cell, that is, based on an active region, gate lines, and contacts or the like included in the adjacent standard cell. Changes in cell characteristics according to a layout of an adjacent cell as described above are referred to as local layout effect (LLE) interaction. Also, in an asymmetric gate structure, fins, gate lines, and contacts may be typically randomly arranged in a front end of line (FEOL) region and a middle of line (MOL) region, which intensify LLE interaction even more.

However, the at least one cell C1 described above may be a primitive cell having an asymmetric gate structure which may reduce LLE interaction. In detail, the at least one cell C1 may have an asymmetric gate structure including an NMOS transistor device and a dummy transistor device, or an asymmetric gate structure including a PMOS transistor device and a dummy transistor device. Arrangement of the gate lines 130, 132, 134, 140 and the contacts 152 and 154 in the at least one cell C1 may form a fixed pattern. Thus, by disposing at least one cell C1 having the fixed pattern, in the integrated circuit 100 at a position where an asymmetric gate structure is required, changes in target cell characteristics due to the LLE interaction may be prevented, minimized or reduced. In particular, as the at least one cell C1 having the fixed pattern may be repeatedly arranged several times in a process of designing the integrated circuit 100, changes in characteristics due to LLE interaction may be minimized or reduced and designing of the integrated circuit 100 may be easy at the same time.

Figure 6:
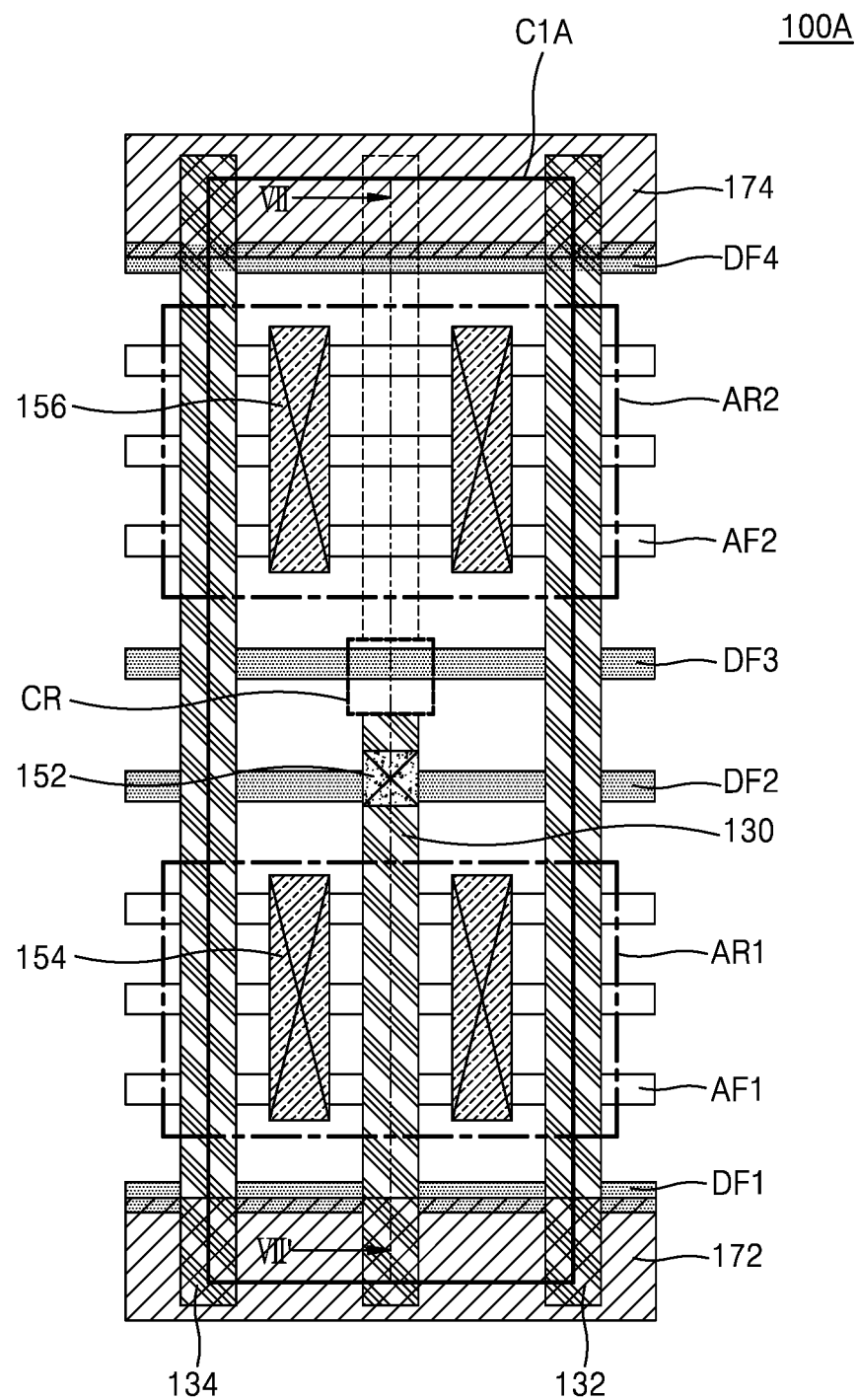
FIG. 6 is a layout of an integrated circuit according to some example embodiments.
Figure 7:
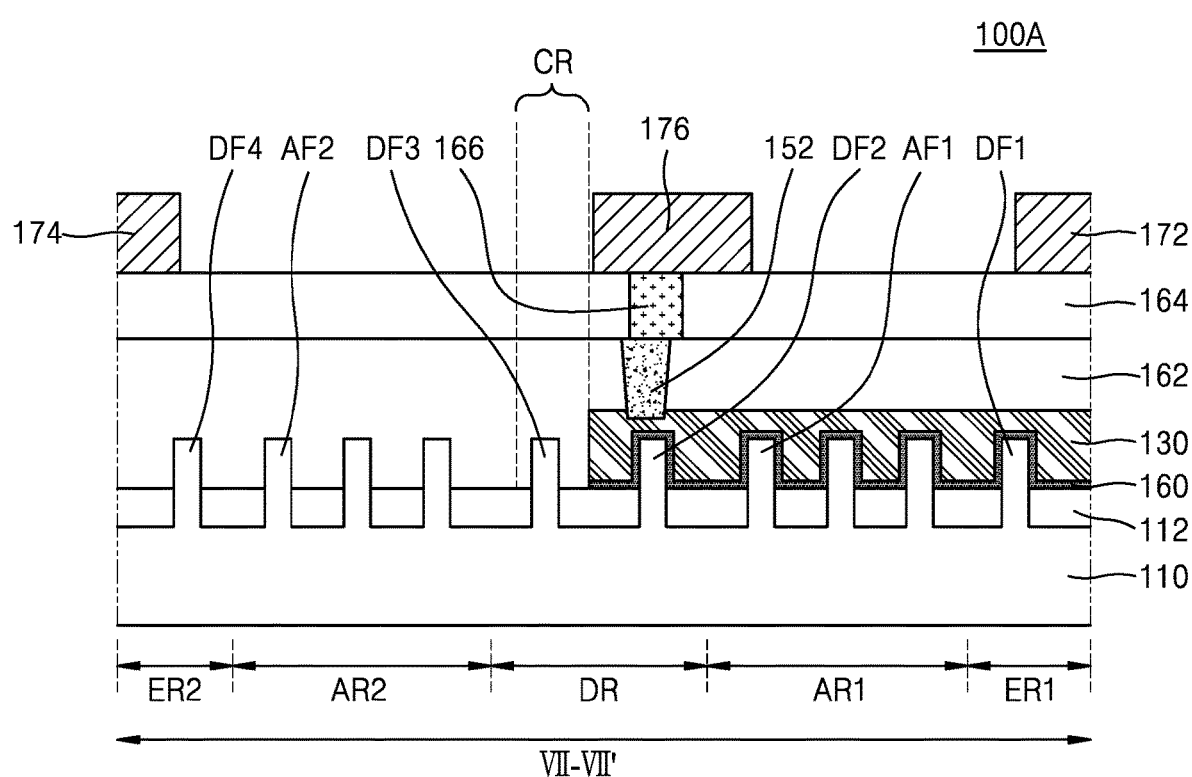
FIG. 7 is a cross-sectional view of the integrated circuit of FIG. 6 cut along a line VII-VII'.

FIG. 6 is a layout of an integrated circuit 100A according to some example embodiments, and FIG. 7 is a cross-sectional view of the integrated circuit 100A of FIG. 6 cut along a line VII-VII'. In FIGS. 6 and 7, like reference numerals as in FIGS. 1 through 5 denote like elements, and detailed description thereof will be omitted.

Referring to FIGS. 6 and 7, the integrated circuit 100A may include at least one cell C1A, and no dummy gate line is formed in a portion where an extension direction of the active gate line 130 and the second active region AR2 overlap each other in the at least one cell C1A. In an example operation of forming the active gate line 130, after forming a gate line (not shown), a portion of the gate line, which overlaps the line cut region CR is removed to form the active gate line 130, and a remaining portion of the gate line disposed in the second active region AR2 may be additionally removed. In this case, the gate line may not be disposed on the at least one second active fin AF2, but instead, the first insulation interlayer 162 may cover an upper portion of the at least one second active fin AF2.

Figure 8:
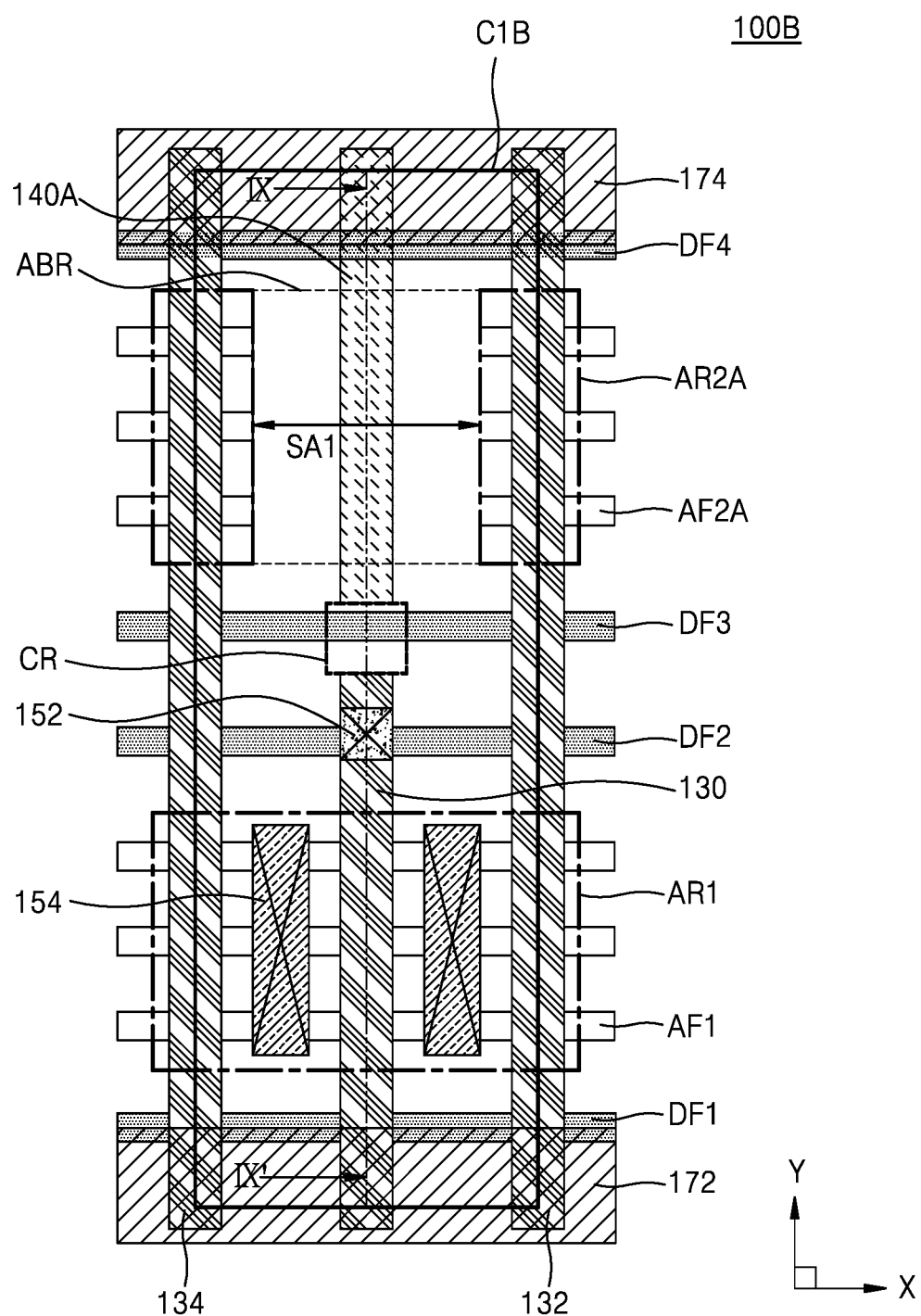
FIG. 8 is a layout of an integrated circuit according to some example embodiments.
Figure 9:
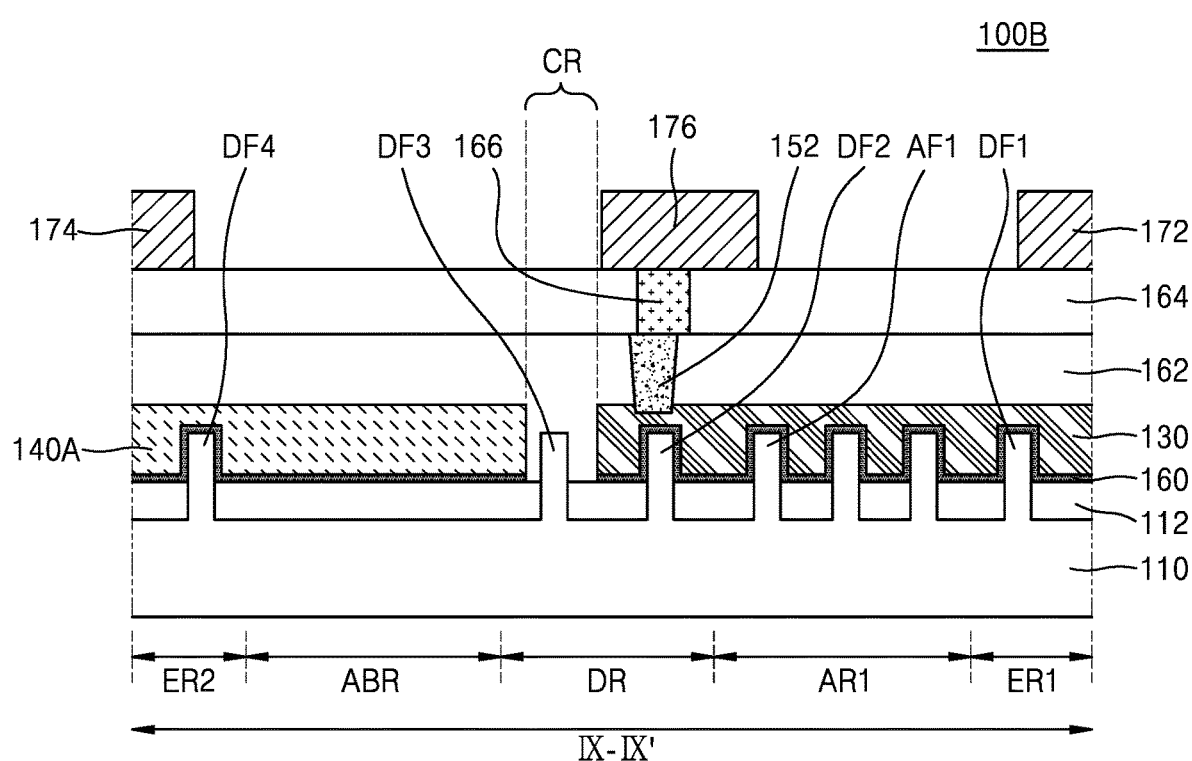
FIG. 9 is a cross-sectional view of the integrated circuit of FIG. 8 cut along a line IX-IX.

FIG. 8 is a layout of an integrated circuit 100B according to some example embodiments, and FIG. 9 is a cross-sectional view of the integrated circuit 100B of FIG. 8 cut along a line IX-IX'. In FIGS. 8 and 9, like reference numerals as in FIGS. 1 through 7 denote like elements, and detailed description thereof will be omitted.

Referring to FIGS. 8 and 9, at least one cell C1B may include an active break region ABR between two second active regions AR2A spaced apart from each other in the first direction (or X direction). At least one second active fin AF2A may be disposed in the second active regions AR2A, and at least one second active fin AF2A may not be disposed in the active break region ABR. A dummy gate line 140A extending in the second direction (or Y direction) may be formed in the active break region ABR. The dummy gate line 140A disposed on the active break region ABR may form a dummy transistor device.

In an example operation of forming the at least one cell C1B, a plurality of fins extending in parallel to one another are formed on the substrate 110, and a mask (not shown) exposing only the active break region ABR is formed to remove portions of the plurality of fins exposed by the mask. Meanwhile, a third width SA1 of the active break region ABR along the first direction may also be referred to as an active-to-active spacing. While the third width SA1 of the active break region ABR is illustrated to be smaller than a distance between the first and second gate lines 132 and 134 in FIG. 8, alternatively, the third width SA1 of the active break region ABR may also be the same as the distance between the first and second gate lines 132 and 134.

Figure 10:
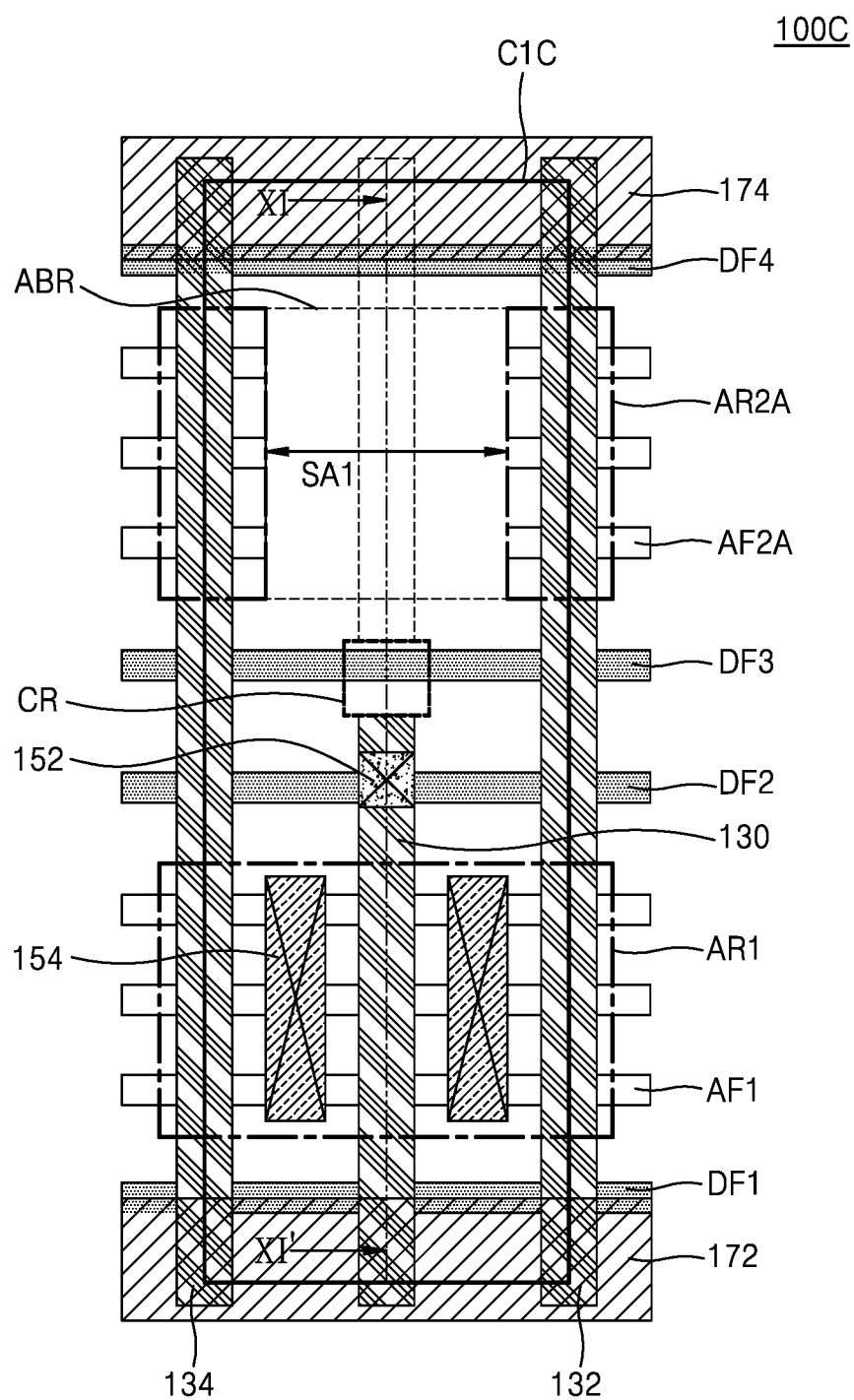
FIG. 10 is a layout of an integrated circuit according to some example embodiments.
Figure 11:
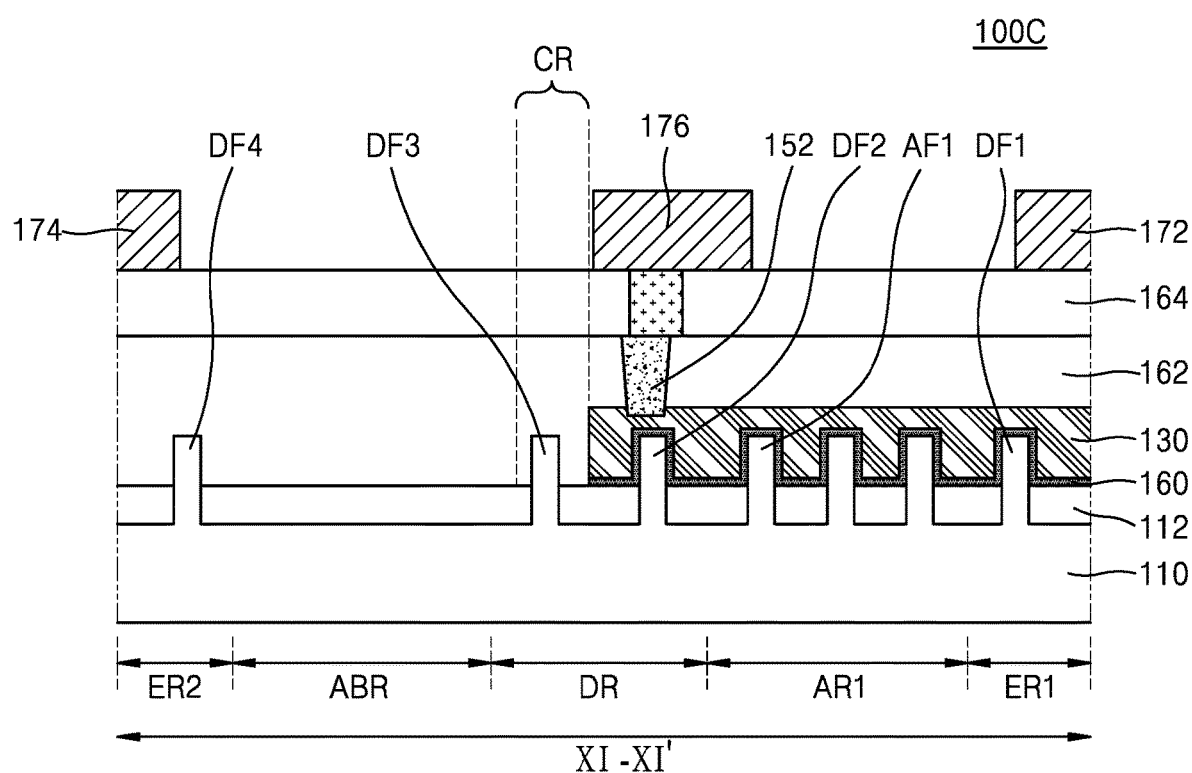
FIG. 11 is a cross-sectional view of the integrated circuit of FIG. 10 cut along a line XI-XI'.

FIG. 10 is a layout of an integrated circuit 100C according to some example embodiments, and FIG. 11 is a cross-sectional view of the integrated circuit 100C of FIG. 10 cut along a line XI-XI'. In FIGS. 10 and 11, like reference numerals as in FIGS. 1 through 9 denote like elements, and detailed description thereof will be omitted.

Referring to FIGS. 10 and 11, no dummy gate line is formed in a portion where an extension direction of the active gate line 130 and the active break region ABR overlap each other in at least one cell C1C. The dummy gate line is not formed in the active break region ABR, and at least one second active fin AF2A may also not be disposed therein, and thus, only an active transistor device formed of the active gate line 130 and first active fins AF1 may be formed in the at least one cell C1C. Accordingly, the at least one cell C1C may have an asymmetric gate structure.

Figure 12:
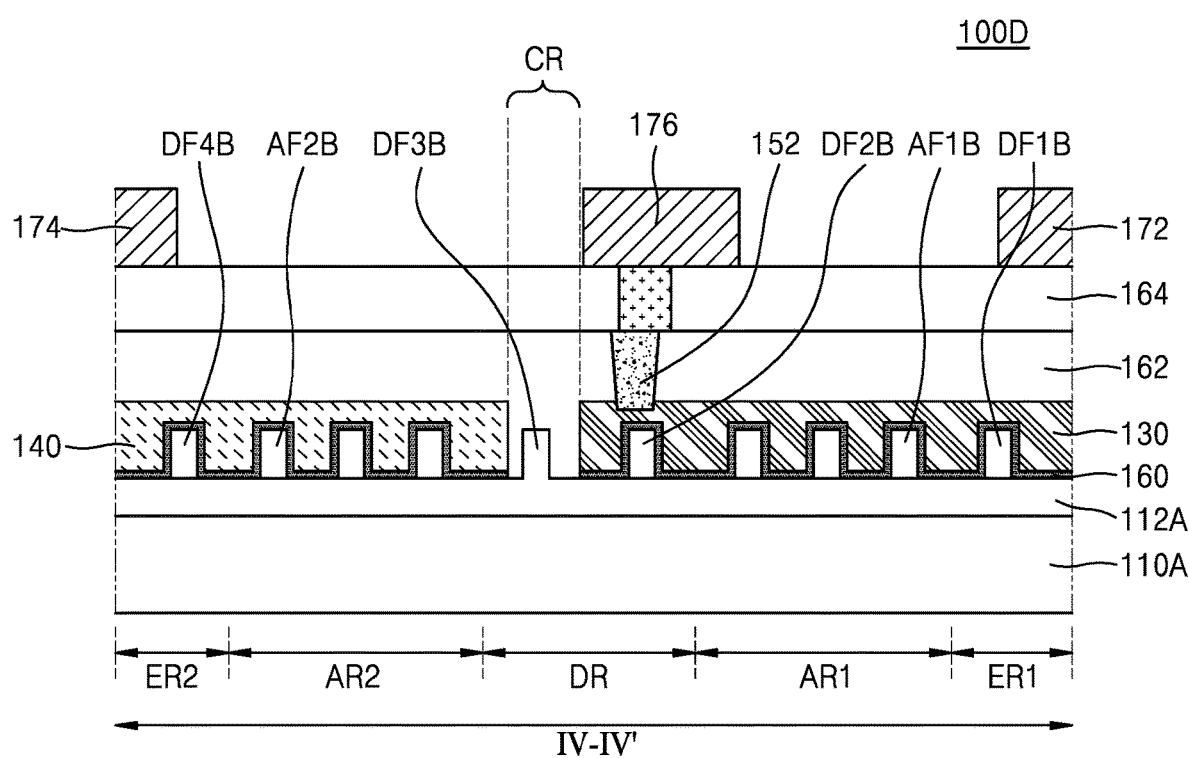
FIG. 12 is a cross-sectional view illustrating an integrated circuit according to some example embodiments.

FIG. 12 is a cross-sectional view illustrating an integrated circuit 100D according to some example embodiments. In FIG. 12, a cross-section of the integrated circuit 100D along the line IV-IV' of FIG. 1 is illustrated. In FIG. 12, like reference numerals denote like elements as in FIGS. 1 through 11, and thus detailed description thereof will be omitted.

Referring to FIG. 12, the integrated circuit 100D may include a silicon-on-insulator (SOI) type fin transistor. In detail, the integrated circuit 100D may include an insulation layer 112A formed on a substrate 110A, and at least one first active fin AF1B, at least one second active fin AF2B, and first through fourth dummy fins DF1B, DF2B, DF3B, and DF4B, disposed on the insulation layer 112A. The at least one first active fin AF1B, the at least one second active fin AF2B, and the first through fourth dummy fins DF1B, DF2B, DF3B, and DF4B may be a semiconductor material such as silicon or doped silicon.

Figure 13:
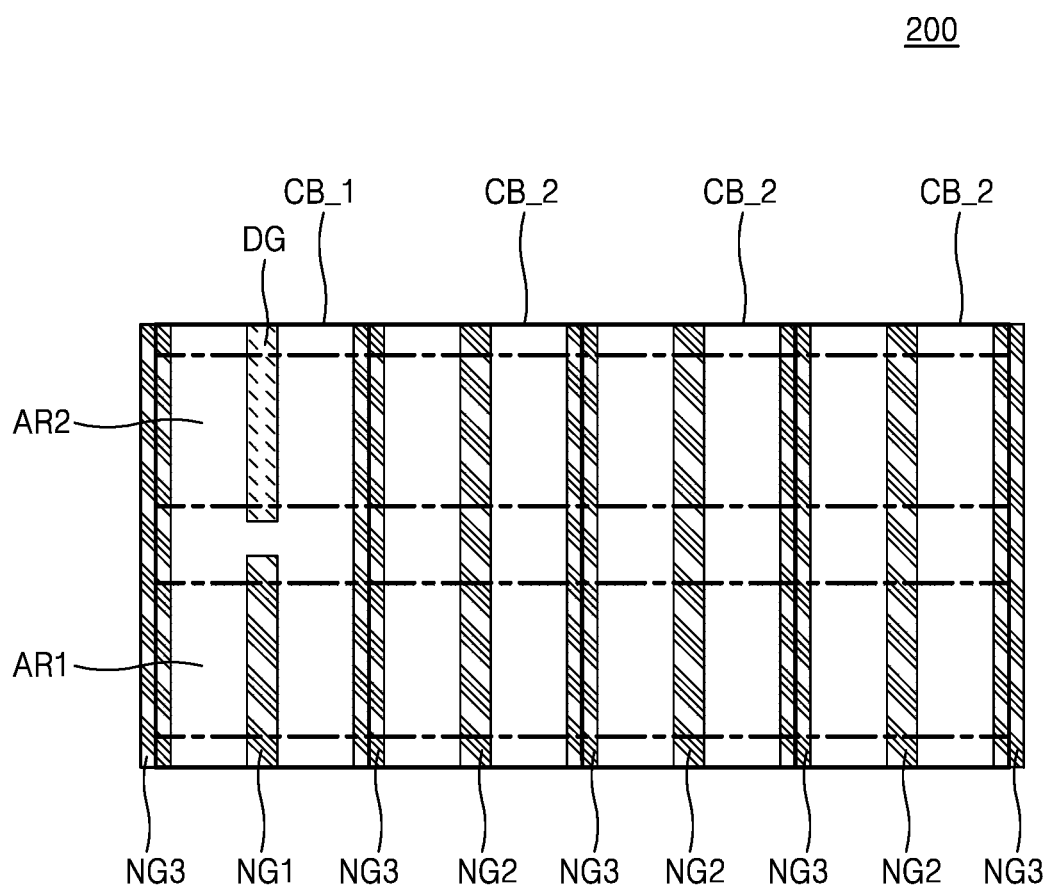
FIG. 13 is a layout illustrating an integrated circuit according to some example embodiments.

FIG. 13 is a layout illustrating an integrated circuit 200 according to some example embodiments.

Referring to FIG. 13, the integrated circuit 200 may include a first cell CB_1 and a second cell CB_2. A first active region AR1 and a second active region AR2 may be spaced apart from each other and extend in a direction, and the first cell CB_1 may be disposed to cross the first active region AR1 and the second active region AR2, and the second cell CB_2 that is immediately adjacent to the first cell CB_1 may be disposed to cross the first active region AR1 and the second active region AR2. In some example embodiments, the first active region AR1 may be a region where an NMOS transistor is formed, and the second active region AR2 may be a region where a PMOS transistor is formed.

The first cell CB_1 may have an asymmetric gate structure. For example, the first cell CB_1 may include the integrated circuits 100, 100A, 100B, 100C, and 100D described with reference to FIGS. 1 through 12. The first cell CB_1 may include a first normal gate NG1 and a dummy gate DG that are spaced apart from each other and disposed along a line, and the first normal gate NG1 and the dummy gate DG may form a portion of an NMOS transistor and a portion of a dummy transistor, respectively.

The second cell CB_2 may have a symmetrical gate structure in which a PMOS transistor and an NMOS transistor are paired. The second cell CB_2 may include a second normal gate NG2 that extends while crossing the first active region AR1 and the second active region AR2, and a portion of the second normal gate NG2 disposed in the first active region AR1 and a portion of the second normal gate NG2 disposed in the second active region AR2 may form a portion of an NMOS transistor and a portion of a PMOS transistor, respectively.

In FIG. 13, while one first cell CB_1 and three second cells CB_2 are illustrated as being arranged in parallel to one another, the example embodiments are not limited thereto, and the number and placement of the first cell CB_1 and the second cell CB_2 may be modified in various manners according to a design of the integrated circuit 200. In addition, a plurality of normal gates NG3 may be disposed along a boundary line between the first cell CB_1 and the second cell CB_2 and/or between the second cells CB_2. The number or placement of the plurality of third normal gates NG3 may also be modified in various manners according to a design of the integrated circuit 200.

Figure 14:
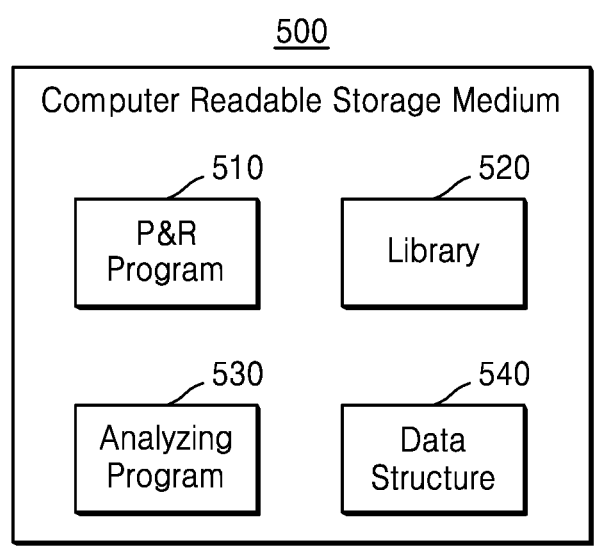
FIG. 14 is a block diagram illustrating a storage medium including a standard cell library according to some example embodiments.

FIG. 14 is a block diagram illustrating a storage medium 500 according to some example embodiments.

Referring to FIG. 14, the storage medium 500 is a computer-readable storage medium, and may include a desired (or, alternative, predetermined) storage medium that is computer-readable while it is being used to provide commands and/or data to a computer. For example, examples of the computer-readable storage medium 500 may include a magnetic or optical medium such as a disk, a tape, a compact disc-read only memory (CD-ROM), a digital versatile disc-read only memory (DVD-ROM), a CD-recordable (CD-R), a CD-rewritable (CD-RW), a DVD-recordable (DVD-R), or a DVD-rewritable (DVD-RW), a volatile or non-volatile memory such as a random access memory (RAM), a read only memory (ROM), or a flash memory, a non-volatile memory that is accessible via a universal serial bus (USB) interface, and a microelectromechanical systems (MEMS). The computer-readable storage medium 500 may be insertable into a computer, integrated into a computer, or coupled to a computer via a communication medium such as a network and/or a wireless link.

As illustrated in FIG. 14, the computer-readable storage medium 500 may include a placement and routing program 510, a library 520, an analysis program 530, and a data structure 540. The placement and routing program 510 may include a plurality of commands to perform a method of designing an integrated circuit by using a standard cell library according to an example embodiment of the inventive concepts. For example, the computer-readable storage medium 500 may store the placement and routing program 510 including desired (or, alternative, predetermined) commands to design an integrated circuit by using a standard cell library including the at least one cell C1, C1A, C1B, C1C, CB_1, or CB_2 described with reference to FIGS. 1 through 13. The library 520 may include information about a standard cell which is a unit of an integrated circuit. The library 520 may include information about the integrated circuit 100, 100A, 100B, 100C, 100D, or 200 described with reference to FIGS. 1 through 13. The analysis program 530 may include a plurality of commands that are used to perform a method of analyzing an integrated circuit based on data that defines the integrated circuit. The data structure 540 may include, for example, storage space for controlling data that is generated when using the standard cell library included in the library 520, when extracting marker information from a general standard cell library included in the library 520, or when analyzing characteristics of an integrated circuit by using the analysis program 530.

While the inventive concepts has been particularly shown and described with reference to example embodiments thereof, it will be understood that various changes in form and details may be made therein without departing from the spirit and scope of the following claims.

What is claimed is:

1. An integrated circuit device comprising:
   at least one cell, the at least one cell including,
      a dummy region on a semiconductor substrate,
      a first active region and a second active region spaced apart from each other, with the dummy region disposed therebetween,
      a plurality of first active fins disposed in the first active region and extending in a first direction and disposed in parallel to one another in a second direction perpendicular to the first direction,
      a plurality of second active fins disposed in the second active region and extending in the first direction and disposed in parallel to one another in the second direction,
      a first gate line extending in the second direction on the first active fins, and
      a second gate line extending in the second direction on the second active fins, the second gate line being spaced apart from the first gate line with a line cut region disposed between the second gate line and the first gate line, the second gate line and the first gate line being in a straight line, the line cut region having a horizontal cross-section having an oval shape, and the second gate line being a dummy gate line.

2. The integrated circuit device of claim 1, wherein the first and second gate lines each have a concave sidewall.

3. The integrated circuit device of claim 1, wherein the at least one cell further comprises:
   an insulating layer in the line cut region between the first gate line and the second gate line, the insulating layer having a horizontal cross-section having an oval shape.

4. The integrated circuit device of claim 3, wherein the first gate line has a concave sidewall, the concave sidewall of the first gate line is recessed inward in the second direction, and the concave sidewall of the first gate line contacts the insulating layer.

5. The integrated circuit device of claim 1, wherein the line cut region is in the dummy region.

6. The integrated circuit device of claim 1, wherein the first gate line extends to a portion of the dummy region, and a first contact is on a portion of the first gate line in the dummy region.

7. The integrated circuit device of claim 6, wherein the first contact has a first width in the second direction, and a first distance between the line cut region and the first contact in the second direction is about 0.5 times to about 5 times the first width.

8. The integrated circuit device of claim 6, wherein the at least one cell further comprises:
   at least one dummy fin in the dummy region and extending in the first direction,
   wherein the first contact or the line cut region vertically overlap the at least one dummy fin.

9. The integrated circuit device of claim 6, wherein the at least one cell further comprises:
   a conductive via on the first contact; and
   a third wiring layer on the conductive via.

10. The integrated circuit device of claim 1, wherein the at least one cell further comprises:
    a first edge region spaced apart from the dummy region, with the first active region therebetween;
    a second edge region spaced apart from the dummy region, with the second active region therebetween;
    a first wiring layer extending in the first direction, the first wiring layer vertically overlapping the first edge region; and
    a second wiring layer extending in the first direction, the second wiring layer vertically overlapping the second edge region.

11. The integrated circuit device of claim 1, the first active region is a region where an NMOS transistor or a PMOS transistor is formed, and the second active region is a region where a dummy transistor is formed.

12. An integrated circuit device comprising:
    at least one cell, the at least one cell including,
       a dummy region on a semiconductor substrate,
       a first active region and a second active region spaced apart from each other, with the dummy region disposed therebetween,
       a plurality of first active fins disposed in the first active region and extending in a first direction and disposed in parallel to one another in a second direction perpendicular to the first direction,
       a plurality of second active fins disposed in the second active region and extending in the first direction and disposed in parallel to one another in the second direction,
       a first gate line extending in the second direction on the first active fins, a second gate line extending in the second direction on the second active fins, the second gate line being spaced apart from the first gate line with a line cut region disposed between the second gate line and the first gate line, the second gate line being a dummy gate line, and
       a first contact on a portion of the first gate line, the first contact disposed in the dummy region,
       wherein the first gate line and the second gate line are disposed in a straight line, and
       the line cut region vertically overlaps the first active region and the dummy region and does not vertically overlap the second active region.

13. The integrated circuit device of claim 12, wherein the at least one cell further comprises:
    an insulating layer in the line cut region between the first gate line and the second gate line,
    the insulating layer having a horizontal cross-section having an oval shape.

14. The integrated circuit device of claim 13, wherein the first gate line has a concave sidewall contacting the insulating layer and the concave sidewall of the first gate line is recessed inward in the second direction,
    the second gate line has a concave sidewall contacting the insulating layer and the concave sidewall of the second gate line is recessed inward in the second direction, and
    the first gate line, the insulating layer, and the second gate line are in a straight line in the second direction.

15. The integrated circuit device of claim 12, wherein the line cut region is spaced apart from the first contact in the second direction.

16. An integrated circuit device comprising:
    at least one cell, the at least one cell including,
       a dummy region on a semiconductor substrate,
       a first active region and a second active region spaced apart from each other, with the dummy region therebetween,
       a plurality of first active fins disposed in the first active region and extending in a first direction and disposed in parallel to one another in a second direction perpendicular to the first direction, a plurality of second active fins in the second active region, extending in the first direction, and in parallel to one another in the second direction, a first gate line extending in the second direction on the plurality of first active fins, and a second gate line extending in the second direction on the second active fins, the second gate line being spaced apart from the first gate line with a line cut region disposed between the second gate line and the first gate line, the second gate line and the first gate line disposed in a straight line, the first and second gate lines having a concave sidewall, and the second gate line being a dummy gate line.

17. The integrated circuit device of claim 16, wherein the at least one cell further comprises:

a plurality of second contacts on the plurality of first active fins and at both sides of the first gate line.

18. The integrated circuit device of claim 16, wherein the line cut region is in the dummy region and spaced apart from each of the first active region and the second active region.

19. The integrated circuit device of claim 16, wherein the at least one cell further comprises:

an insulating layer in the line cut region between the first gate line and the second gate line, wherein the line cut region has a horizontal cross-section having an oval shape, the concave sidewall of the first gate line is recessed inward in the second direction, and the concave sidewall of the first gate line contacts the insulating layer.

\* \* \* \* \*